(12) United States Patent
Yang et al.

(10) Patent No.: US 9,310,444 B2
(45) Date of Patent: Apr. 12, 2016

(54) BATTERY TESTING SYSTEM AND METHOD

(71) Applicant: FORD GLOBAL TECHNOLOGIES, LLC, Dearborn, MI (US)

(72) Inventors: Xiao Guang Yang, Northville, MI (US); Renata Michaela Arsenault, Plymouth, MI (US); Theodore James Miller, Milan, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 281 days.

(21) Appl. No.: 14/155,644

(22) Filed: Jan. 15, 2014

(65) Prior Publication Data

US 2015/0198673 A1    Jul. 16, 2015

(51) Int. Cl.

| H01M 10/44 | (2006.01) |
|---|---|
| G01R 31/36 | (2006.01) |
| H01M 6/50 | (2006.01) |
| H01M 10/42 | (2006.01) |
| H01M 10/48 | (2006.01) |
| G01R 19/165 | (2006.01) |
| G01R 27/00 | (2006.01) |

(52) U.S. Cl.
CPC ........ *G01R 31/3662* (2013.01); *G01R 31/3627* (2013.01); *H01M 6/5083* (2013.01); *H01M 10/4285* (2013.01); *H01M 10/48* (2013.01); *G01R 19/16542* (2013.01); *G01R 27/00* (2013.01); *H01M 2220/20* (2013.01)

(58) Field of Classification Search
CPC ........... H01M 6/5083; H01M 10/4285; G01R 19/16542; G01R 27/00
USPC .......................................................... 429/61
See application file for complete search history.

(56) References Cited

U.S. PATENT DOCUMENTS

| 5,747,188 | A | * | 5/1998 | Von Sacken | ............ | H01M 2/34 |
|---|---|---|---|---|---|---|
| | | | | | | 429/231.3 |
| 6,682,850 | B1 | * | 1/2004 | Numata | ................ | H01M 4/131 |
| | | | | | | 429/209 |
| 8,081,000 | B2 | | 12/2011 | Kasamatsu et al. | | |
| 8,163,409 | B2 | | 4/2012 | Fujikawa et al. | | |
| 8,168,314 | B2 | | 5/2012 | Fujikawa et al. | | |
| 2009/0305144 | A1 | * | 12/2009 | Koh | .................. | H01M 10/0568 |
| | | | | | | 429/332 |
| 2010/0136429 | A1 | | 6/2010 | Muraoka et al. | | |

FOREIGN PATENT DOCUMENTS

| JP | 2002298915 | 10/2002 |
|---|---|---|
| JP | 2010212183 | 9/2010 |
| JP | 4887581 | 12/2011 |
| KR | 20050014426 | 2/2005 |

OTHER PUBLICATIONS

M. Chami, et al., "Safe Li-Ion Technology for Micro and Mild Hybrid Application Based on CEA Bipolar LIFEPO4/LI4TI5012 Technology," EVS24, Stavanger, Norway, May 13-16, 2009.

* cited by examiner

*Primary Examiner* — Basia Ridley
*Assistant Examiner* — James Erwin
(74) *Attorney, Agent, or Firm* — Carlson, Gaskey & Olds

(57) ABSTRACT

A battery testing system according to an exemplary aspect of the present disclosure includes, among other things, a penetrating device and an impedance meter electrically connected to the penetrating device.

19 Claims, 4 Drawing Sheets

BATTERY TESTING SYSTEM AND METHOD

TECHNICAL FIELD

This disclosure relates to electrified vehicles, and more particularly, but not exclusively, to a battery testing system and method for evaluating the response of a battery cell to an unintended puncture or other cell damage.

BACKGROUND

Hybrid electric vehicles (HEV's), plug-in hybrid electric vehicles (PHEV's), battery electric vehicles (BEV's), fuel cell vehicles and other known electrified vehicles differ from conventional motor vehicles in that they are powered by one or more electric machines (i.e., electric motors and/or generators) instead of or in addition to an internal combustion engine. High voltage current is typically supplied to the electric machines by one or more batteries that store electrical power.

Electrified vehicle batteries may employ one or more battery cells, such as lithium-ion battery cells. Tests for evaluating the safety of such battery cells are known. One common evaluation test is referred to as the nail penetration test. During this test, a nail is driven through a battery cell to create a short circuit inside the battery cell. In response to the destructive test, battery temperatures and voltages are measured. One drawback to known battery penetration tests is that these tests reveal little to no detail concerning the internal response of the battery cell.

SUMMARY

A battery testing system according to an exemplary aspect of the present disclosure includes, among other things, a penetrating device and an impedance meter electrically connected to the penetrating device.

In a further non-limiting embodiment of the foregoing system, the penetrating device is a nail.

In a further non-limiting device of either of the foregoing systems, the penetrating device is movable between a first position and a second position to puncture and short circuit a battery cell.

In a further non-limiting device of any of the foregoing systems, the impedance meter is connected to a positive terminal or a negative terminal of the battery cell and is configured to measure impedance and voltage data between the penetrating device and a terminal of the battery cell.

In a further non-limiting device of any of the foregoing systems, the impedance meter is connected to a positive terminal and a second impedance meter is connected to a negative terminal of the battery cell.

In a further non-limiting device of any of the foregoing systems, a voltage meter is configured to measure a voltage across a positive terminal and a negative terminal of the battery cell.

In a further non-limiting device of any of the foregoing systems, a temperature sensor is configured to measure a temperature of the battery cell.

In a further non-limiting device of any of the foregoing systems, a tool moves the penetrating device between a first position and a second position to puncture a battery cell.

In a further non-limiting device of any of the foregoing systems, the penetrating device includes a first portion having a non-conductive coating and a second portion that excludes the non-conductive coating.

In a further non-limiting device of any of the foregoing systems, the second portion of the penetrating device includes a pointed tip.

A battery testing system according to another exemplary aspect of the present disclosure includes, among other things, a battery cell, a penetrating device configured to short circuit the battery cell and an impedance meter electrically connected to the battery cell and the penetrating device and configured to measure at least impedance data between the battery cell and the penetrating device.

In a further non-limiting embodiment of the foregoing system, the impedance meter is electrically connected between a positive terminal or a negative terminal of the battery cell and the penetrating device.

In a further non-limiting device of either of the foregoing systems, a second impedance meter is electrically connected to the penetrating device and a terminal of the battery cell.

In a further non-limiting device of any of the foregoing systems, the impedance meter is connected to a positive terminal of the battery cell and the second impedance meter is connected to a negative terminal of the battery cell.

In a further non-limiting device of any of the foregoing systems, a data acquisition system is configured to collect and analyze the impedance data from the impedance meter.

A method according to another exemplary aspect of the present disclosure includes, among other things, creating a short circuit in a battery cell and measuring impedance data associated with the battery cell in response to the step of creating the short circuit.

In a further non-limiting embodiment of the foregoing method, the step of creating the short circuit includes penetrating the battery cell with a penetrating device.

In a further non-limiting embodiment of either of the foregoing methods, the method includes measuring voltage data associated with the battery cell.

In a further non-limiting embodiment of any of the foregoing methods, the method includes calculating a transient current through the short circuit using the impedance data and the voltage data.

In a further non-limiting embodiment of any of the foregoing methods, the method includes electrically connecting an impedance meter to a penetrating device and the battery cell.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure relates to a battery testing system and method for evaluating the safety and design of a battery cell. The inventive battery testing system collects alternating current (AC) impedance data between a conductive penetrating device, such as a nail, and the battery cell. The impedance data may be collected using one or more impedance meters. The impedance data is collected and analyzed to calculate a transient current through a short circuit created in the battery cell by the penetrating device. The transient current calculations may then be used to improve the design and safety of the battery cell.

Figure 1:
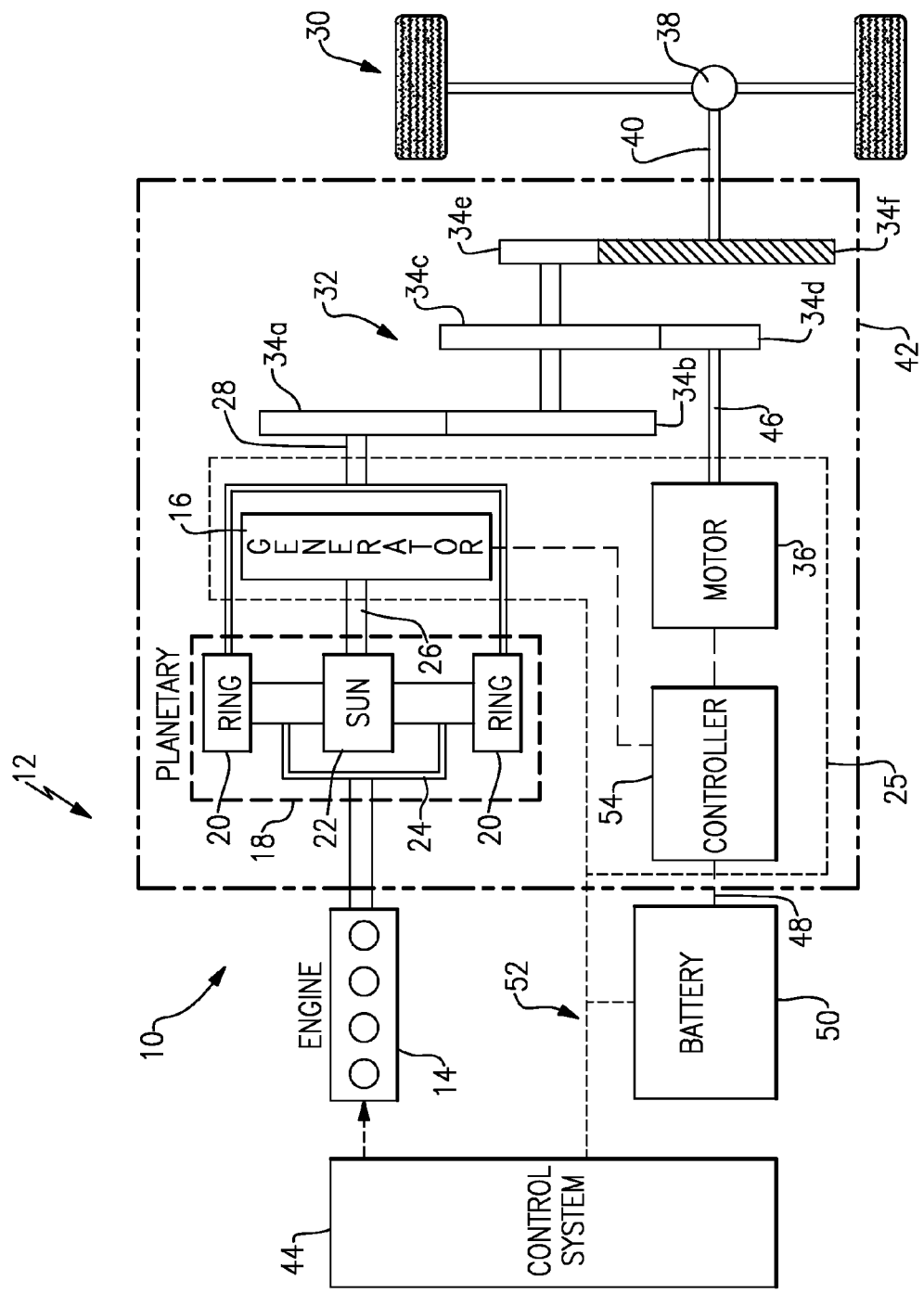
FIG. 1 schematically illustrates a powertrain of an electrified vehicle.

FIG. 1 schematically illustrates a powertrain 10 for an electrified vehicle 12, such as a HEV. Although depicted as a HEV, it should be understood that the concepts described herein are not limited to HEV's and could extend to other electrified vehicles, including but not limited to, PHEV's, BEV's, and fuel cell vehicles.

In one embodiment, the powertrain 10 is a power split system that employs a first drive system that includes a combination of an engine 14 and a generator 16 (i.e., a first electric machine) and a second drive system that includes at least a motor 36 (i.e., a second electric machine), the generator 16 and a battery 50. For example, the motor 36, the generator 16 and the battery 50 may make up an electric drive system 25 of the powertrain 10. The first and second drive systems generate torque to drive one or more sets of vehicle drive wheels 30 of the electrified vehicle 12.

The engine 14, such as an internal combustion engine, and the generator 16 may be connected through a power transfer unit 18. In one non-limiting embodiment, the power transfer unit 18 is a planetary gear set. Of course, other types of power transfer units, including other gear sets and transmissions, may be used to connect the engine 14 to the generator 16. The power transfer unit 18 may include a ring gear 20, a sun gear 22 and a carrier assembly 24. The generator 16 is driven by the power transfer unit 18 when acting as a generator to convert kinetic energy to electrical energy. The generator 16 can alternatively function as a motor to convert electrical energy into kinetic energy, thereby outputting torque to a shaft 26 connected to the carrier assembly 24 of the power transfer unit 18. Because the generator 16 is operatively connected to the engine 14, the speed of the engine 14 can be controlled by the generator 16.

The ring gear 20 of the power transfer unit 18 may be connected to a shaft 28 that is connected to vehicle drive wheels 30 through a second power transfer unit 32. The second power transfer unit 32 may include a gear set having a plurality of gears 34A, 34B, 34C, 34D, 34E, and 34F. Other power transfer units may also be suitable. The gears 34A-34F transfer torque from the engine 14 to a differential 38 to provide traction to the vehicle drive wheels 30. The differential 38 may include a plurality of gears that enable the transfer of torque to the vehicle drive wheels 30. The second power transfer unit 32 is mechanically coupled to an axle 40 through the differential 38 to distribute torque to the vehicle drive wheels 30.

The motor 36 can also be employed to drive the vehicle drive wheels 30 by outputting torque to a shaft 46 that is also connected to the second power transfer unit 32. In one embodiment, the motor 36 and the generator 16 are part of a regenerative braking system in which both the motor 36 and the generator 16 can be employed as motors to output torque. For example, the motor 36 and the generator 16 can each output electrical power to a high voltage bus 48 and the battery 50.

The battery 50 may be a high voltage battery made up of one or more battery cells that are capable of outputting electrical power to operate the motor 36 and the generator 16. Other types of energy storage devices and/or output devices can also be incorporated for use with the electrified vehicle 12.

The motor 36, the generator 16, the power transfer unit 18, and the power transfer unit 32 may generally be referred to as a transaxle 42, or transmission, of the electrified vehicle 12. Thus, when a driver selects a particular shift position, the transaxle 42 is appropriately controlled to provide the corresponding gear for advancing the electrified vehicle 12 by providing traction to the vehicle drive wheels 30.

The powertrain 10 may additionally include a control system 44 for monitoring and/or controlling various aspects of the electrified vehicle 12. For example, the control system 44 may communicate with the electric drive system 25, the power transfer units 18, 32 or other components to monitor and/or control the electrified vehicle 12. The control system 44 includes electronics and/or software to perform the necessary control functions for operating the electrified vehicle 12. In one embodiment, the control system 44 is a combination vehicle system controller and powertrain control module (VSC/PCM). Although it is shown as a single hardware device, the control system 44 may include multiple controllers in the form of multiple hardware devices, or multiple software controllers within one or more hardware devices.

A controller area network (CAN) 52 allows the control system 44 to communicate with the transaxle 42. For example, the control system 44 may receive signals from the transaxle 42 to indicate whether a transition between shift positions is occurring. The control system 44 could also communicate with a battery control module of the battery 50, or other control devices.

Additionally, the electric drive system 25 may include one or more controllers 54, such as an inverter system controller (ISC). The controller 54 is configured to control specific components within the transaxle 42, such as the generator 16 and/or the motor 36, such as for supporting bidirectional power flow. In one embodiment, the controller 54 is an inverter system controller combined with a variable voltage converter (ISC/VVC).

Figure 2:
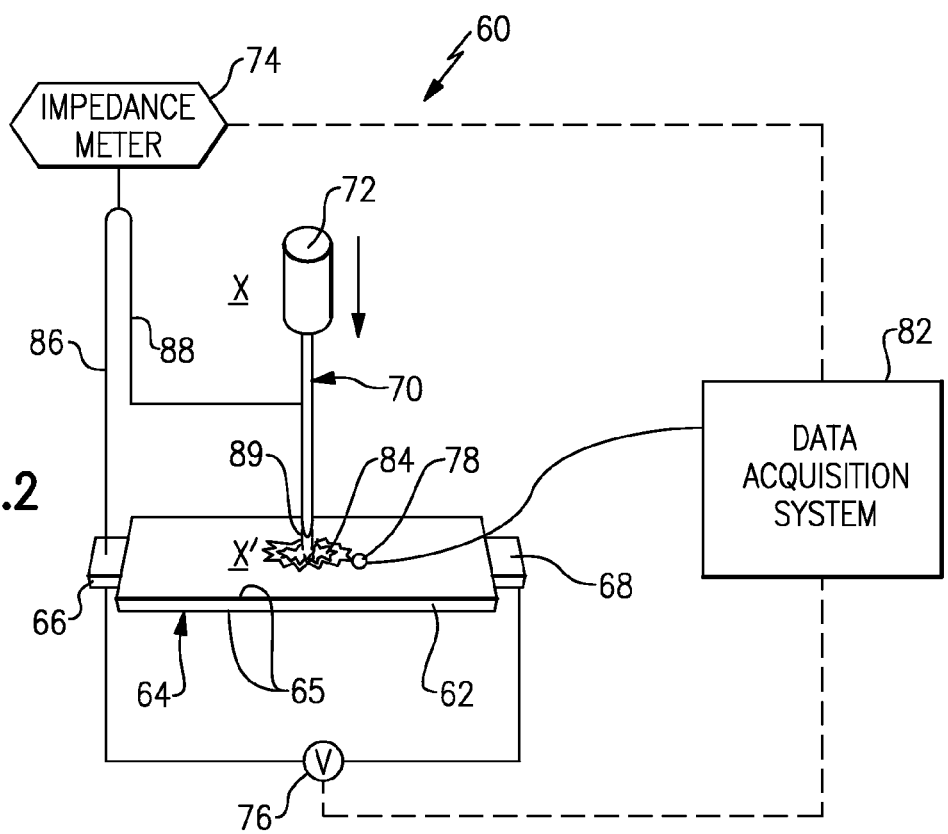
FIG. 2 illustrates a first embodiment of a battery testing system.

FIG. 2 illustrates a battery testing system 60 for testing and evaluating a battery cell 62. For example, as is discussed in greater detail below, the battery testing system 60 may be used to detect an internal short circuit (and associated short circuit current flow) of the battery cell 62 in order to evaluate the safety and design of the battery cell 62.

The battery cell 62 could be part of the battery 50 of the electrified vehicle 12 described with respect to FIG. 1. However, the battery testing system 60 may be utilized to evaluate other battery cells, for any application, within the scope of this disclosure.

In one embodiment, the battery cell 62 includes a cell body 64 having opposing faces 65. The opposing faces 65 extend between a positive terminal 66 and a negative terminal 68 of the battery cell 62. Although shown as a prismatic cell, the battery cell 62 could be any type of cell including but not limited to laminate pouch, prismatic metal can or cylindrical can.

A penetrating device 70 of the battery testing system 60 may be used to penetrate the cell body 64 of the battery cell 62 in order to create a short circuit between the positive terminal 66 and the negative terminal 68. In one embodiment, the penetrating device 70 is a nail. Other devices could potentially be used to penetrate the cell body 64 of the battery cell 62, and these devices could include any size, shape, material and configuration. In one embodiment, the battery cell 62 is fully charged prior to performing a battery penetration test with the battery testing system 60. However, the test can be performed at any state of charge, and can be used to explore changing abuse tolerance properties as a function of state of charge.

In one embodiment, the penetrating device 70 is configured to create a puncture 84 through one or both of the opposing faces 65 in order to simulate an internal shorting condition of the battery cell 62. For example, the penetrating device 70 may include a pointed tip 89 for penetrating or puncturing the battery cell 62.

The penetrating device 70 may be moved by a tool 72 between a first position X and a second position X' (shown in phantom) in order to penetrate the battery cell 62. For example, in the first position X the penetrating device 70 is spaced away from the battery cell 62, and in the second position X' the penetrating device 70 is moved to a position in which the penetrating device 70 has punctured through at least one of the opposing faces 65 of the battery cell 62.

The tool 72 may move the penetrating device 70 linearly between the first position X and the second position X', in one embodiment. The tool 72 can be actuated to control various parameters of the battery penetration test, including the speed at which the penetrating device 70 is moved to puncture the battery cell 62. In one non-limiting embodiment, the tool 72 moves the penetrating device 70 at a speed of 80 mm/second during the battery penetration test. Other testing parameters are contemplated as within the scope of this disclosure, including other testing speeds. For example, slower testing speeds may provide higher quality data.

An impedance meter 74 may be electrically connected to the penetrating device 70 and one or both of the positive terminal 66 and negative terminal 68 of the battery cell 62. The impedance meter 74 is a diagnostic tool operable to measure impedance and voltage data between the penetrating device 70 and the battery cell 62. In one non-limiting embodiment, the impedance meter 74 is a commercially available product that operates at a certain frequency (i.e., 1 kHz, 10 kHz, etc.). However, other impedance measuring devices may also be utilized within the scope of this disclosure.

Figure 3:
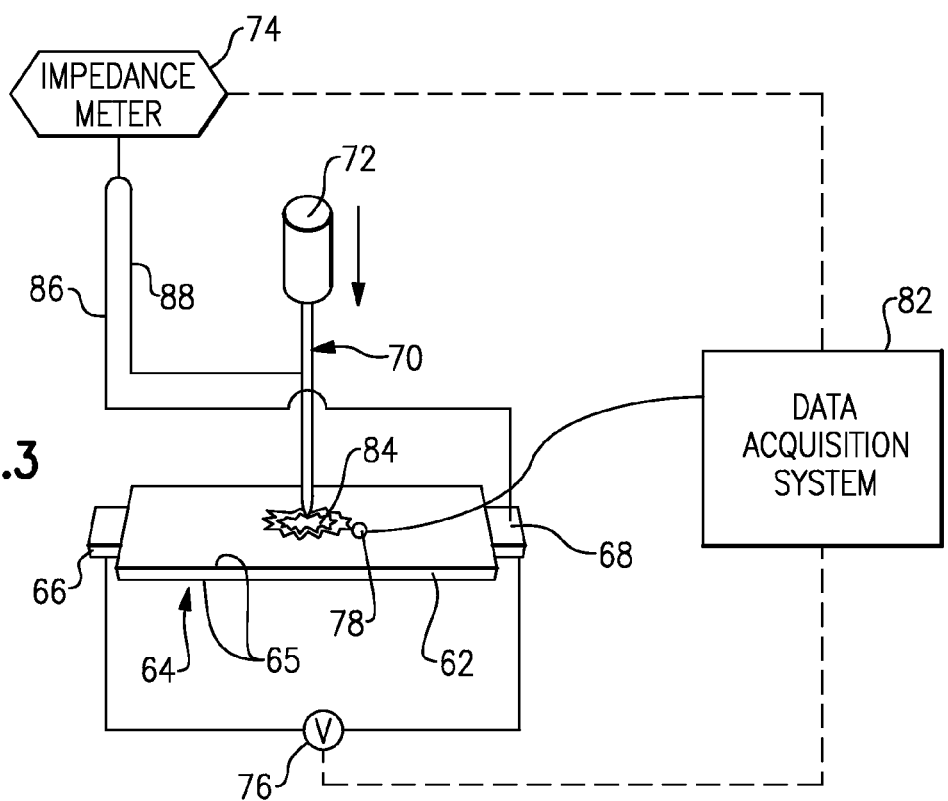
FIG. 3 illustrates a second embodiment of a battery testing system.

In one embodiment, the impedance meter 74 is connected to the positive terminal 66 of the battery cell 62 via a first electrode 86 and to the penetrating device 70 via a second electrode 88 (see FIG. 2). In another embodiment, the impedance meter 74 is connected to the negative terminal 68 of the battery cell 62 (see FIG. 3) with the first electrode 86 and to the penetrating device 70 via the second electrode 88. In other words, the impedance data may be collected between the penetrating device 70 and either the positive terminal 66 or the negative terminal 68 of the battery cell 62.

The battery testing system 60 may also employ a voltage meter 76. The voltage meter 76 may be utilized to measure voltage data across the positive terminal 66 and the negative terminal 68 of the battery cell 62.

Optionally, the battery testing system 60 may also include a temperature sensor 78 for measuring a temperature associated with the battery cell 62. In one non-limiting embodiment, the temperature sensor 78 is positioned near the puncture 84 of the battery cell 62. However, the temperature sensor 78 may be positioned at other locations within the scope of this disclosure.

In response to the penetrating device 70 creating a short circuit in the battery cells 62, the battery testing system 60 measures the impedance data, voltage data and/or temperature data using the impedance meter 74, the voltage meter 76 and, optionally, the temperature sensor 78, respectively. This data may be communicated to a data acquisition system 82 of the battery testing system 60. The data acquisition system 82 is configured to receive, store and analyze the impedance data, voltage data and/or temperature data in order to evaluate the design and safety of the battery cell 62. The data acquisition system 82 may include the necessary hardware and software for converting the impedance data, voltage data and/or temperature data into digital numeric values that can be manipulated by a computer.

For example, in one non-limiting embodiment, the data acquisition system 82 may be utilized to analyze this data in order to calculate the transient current and heat associated with a short circuit of the battery cell 62 responsive to a battery penetration test. This information can then be used by a battery designer to improve the design and safety of the battery cell 62.

Figure 4:
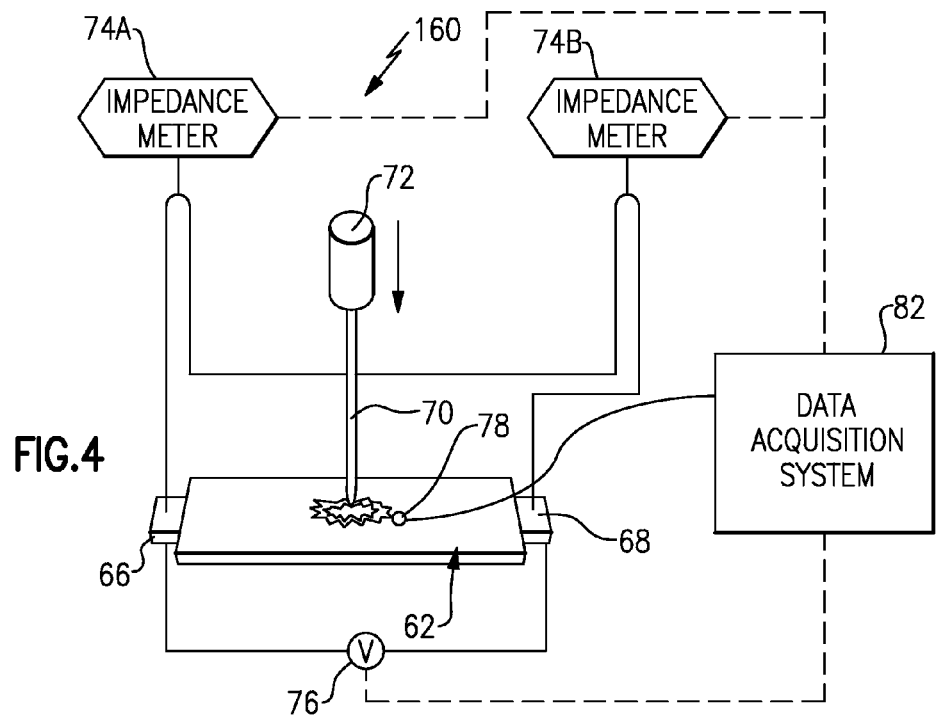
FIG. 4 illustrates a third embodiment of a battery testing system.

FIG. 4 illustrates another exemplary battery testing system 160. In this disclosure, like reference numerals designate like elements where appropriate and reference numerals with the addition of 100 or multiples thereof designate modified elements that are understood to incorporate the same features and benefits of the corresponding original elements.

In this embodiment, the battery testing system 160 includes a first impedance meter 74A and a second impedance meter 74B. The first impedance meter 74A is electrically connected to the positive terminal 66 of a battery cell 62, and the second impedance meter 74B is electrically connected to the negative terminal 68 of the battery cell 62. In this way, two sets of impedance data may be collected simultaneously in response to creating a short circuit in the battery cell 62 with a penetrating device 70.

Figure 5:
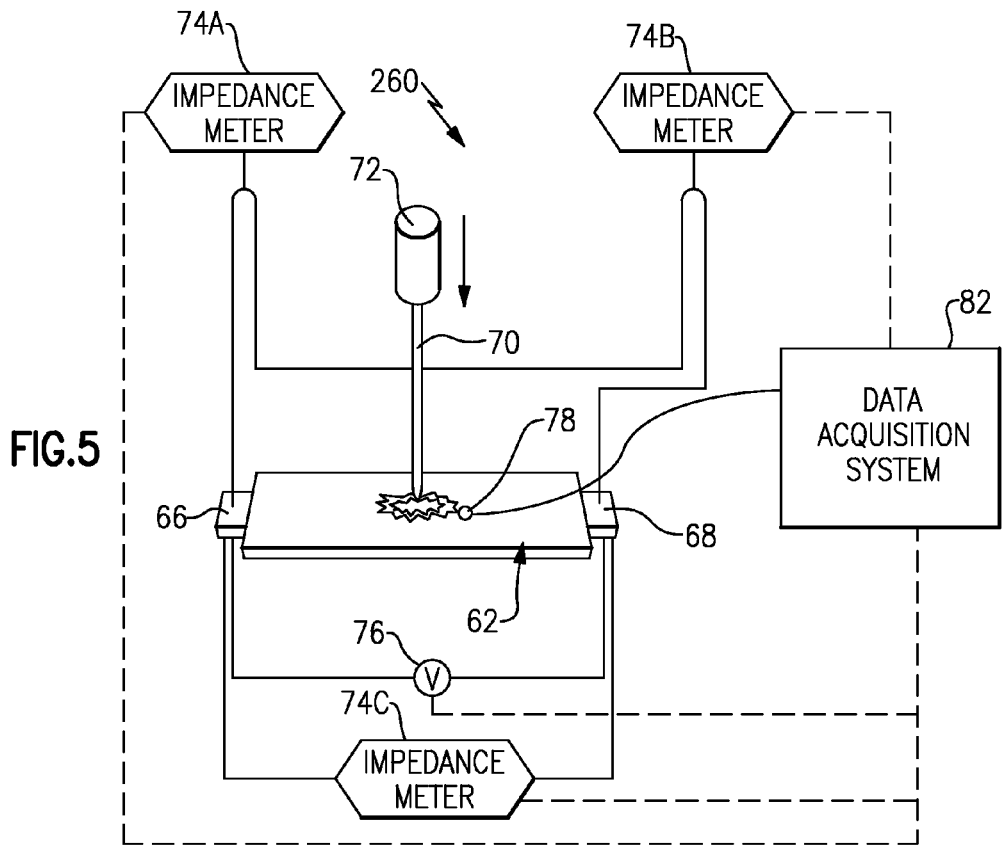
FIG. 5 illustrates a fourth embodiment of a battery testing system.

FIG. 5 illustrates yet another battery testing system 260. In this embodiment, the battery testing system 260 incorporates a third impedance meter 74C in addition to the first impedance meter 74A and the second impedance meter 74B. In one embodiment, the third impedance meter 74C measures impedance data across the positive terminal 66 and negative terminal 68 of the battery cell 62. In this way, three sets of impedance data may be collected simultaneously (i.e., positive terminal, negative terminal, whole cell). In general, a more accurate analysis of the safety and design of the battery cell 62 may be completed by collecting a greater amount of impedance data.

Figure 6:
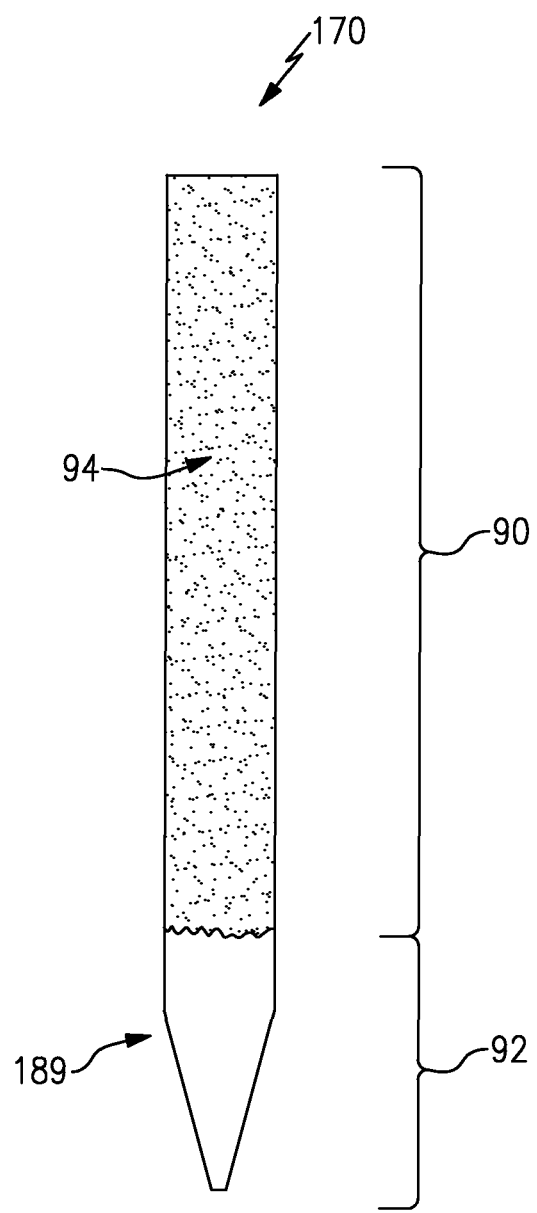
FIG. 6 illustrates an exemplary penetrating device that may be employed by a battery testing system.

FIG. 6 illustrates a penetrating device 170 that may be used with any of the battery testing systems 60, 160, 260 described above. In this embodiment, the penetrating device 170 includes a first portion 90 and a second portion 92. The second portion 92 includes a pointed tip 189, in one embodiment. The pointed tip 189 enables the penetrating device 170 to more easily penetrate a battery cell during a battery penetration test. The pointed tip 189 may be sharp or rounded within the scope of this disclosure.

In one embodiment, the first portion 90 may be coated with an anti-conductive coating 94. In one non-limiting embodiment, the anti-conductive coating 94 includes plastic, although other non-conductive materials are also contemplated herein. In contrast, the second portion 92 excludes any anti-conductive coating. In other words, the first portion 90 is coated or otherwise modified to restrict the conductive portion of the penetrating device 170 to only those portions that are not coated by the anti-conductive coating 94. This significantly minimizes any non-idealities associated with introducing a conductive path from a battery cell and is expected to more closely approximate cell behavior during a true internal short circuit.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A battery testing system, comprising:
   a penetrating device configured as a nail; and
   an impedance meter electrically connected to said penetrating device.

2. The system as recited in claim 1, wherein said penetrating device is movable between a first position and a second position to puncture and short circuit a battery cell.

3. The system as recited in claim 2, wherein said impedance meter is connected to a positive terminal or a negative terminal of said battery cell and is configured to measure impedance and voltage data between said penetrating device and a terminal of said battery cell.

4. The system as recited in claim 2, wherein said impedance meter is connected to a positive terminal and a second impedance meter is connected to a negative terminal of said battery cell.

5. The system as recited in claim 2, comprising a voltage meter configured to measure a voltage across a positive terminal and a negative terminal of said battery cell.

6. The system as recited in claim 2, comprising a temperature sensor configured to measure a temperature of said battery cell.

7. The system as recited in claim 1, comprising a tool that moves said penetrating device between a first position and a second position to puncture a battery cell.

8. The system as recited in claim 1, wherein said penetrating device includes a first portion having a non-conductive coating and a second portion that excludes said non-conductive coating.

9. The system as recited in claim 8, wherein said second portion of said penetrating device includes a pointed tip.

10. A battery testing system, comprising:
    a battery cell;
    a penetrating device configured as a nail and configured to short circuit said battery cell; and
    an impedance meter electrically connected to said battery cell and said penetrating device and configured to measure at least impedance data between said battery cell and said penetrating device.

11. The system as recited in claim 10, wherein said impedance meter is electrically connected between a positive terminal or a negative terminal of said battery cell and said penetrating device.

12. The system as recited in claim 10, comprising a second impedance meter electrically connected to said penetrating device and a terminal of said battery cell.

13. The system as recited in claim 12, wherein said impedance meter is connected to a positive terminal of said battery cell and said second impedance meter is connected to a negative terminal of said battery cell.

14. The system as recited in claim 10, comprising a data acquisition system configured to collect and analyze said impedance data from said impedance meter.

15. A method, comprising:
    creating a short circuit in a battery cell using a penetrating device configured as a nail; and
    measuring impedance data associated with the battery cell in response to the step of creating the short circuit.

16. The method as recited in claim 15, wherein the step of creating the short circuit includes penetrating the battery cell with a penetrating device.

17. The method as recited in claim 15, comprising measuring voltage data associated with the battery cell.

18. The method as recited in claim 17, comprising calculating a transient current through the short circuit using the impedance data and the voltage data.

19. The method as recited in claim 15, comprising electrically connecting an impedance meter to a penetrating device and the battery cell.

* * * * *

UNITED STATES PATENT AND TRADEMARK OFFICE
CERTIFICATE OF CORRECTION

PATENT NO. : 9,310,444 B2
APPLICATION NO. : 14/155644
DATED : April 12, 2016
INVENTOR(S) : Xiao Guang Yang It is certified that error appears in the above-identified patent and that said Letters Patent is hereby corrected as shown below:

IN THE CLAIMS:

Claim 16, column 8, line 38; delete "a" and replace with --the--

Claim 19, column 8, line 45; delete "a" and replace with --the--

Signed and Sealed this
Nineteenth Day of July, 2016

Michelle K. Lee
*Director of the United States Patent and Trademark Office*